(12) United States Patent
Johnson

(10) Patent No.: US 6,624,999 B1
(45) Date of Patent: Sep. 23, 2003

(54) ELECTROSTATIC DISCHARGE PROTECTION USING INDUCTORS

(75) Inventor: Jeffrey L. Johnson, Citrus Heights, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/989,984

(22) Filed: Nov. 20, 2001

(51) Int. Cl.[7] ................................................ H02H 1/00
(52) U.S. Cl. ....................................................... 361/113
(58) Field of Search .............................. 361/56, 57, 58, 361/91.7, 111, 119, 135

(56) References Cited

U.S. PATENT DOCUMENTS

| | | | | |
|---|---|---|---|---|
| 5,835,327 A | * | 11/1998 | Siew et al. | 361/111 |
| 5,900,745 A | * | 5/1999 | Takahashi | 326/64 |
| 6,034,400 A | * | 3/2000 | Waggoner et al. | 257/355 |
| 6,071,801 A | * | 6/2000 | Wachtler et al. | 438/612 |
| 6,459,343 B1 | * | 10/2002 | Miller | 333/32 |
| 6,509,779 B2 | * | 1/2003 | Yue et al. | 327/310 |

* cited by examiner

*Primary Examiner*—Gregory J. Toatley, Jr.
*Assistant Examiner*—Boris Benenson
(74) *Attorney, Agent, or Firm*—Kenneth J. Cool

(57) ABSTRACT

The invention provides electrostatic discharge (ESD) protection for a circuit. In a preferred embodiment, an inductor is coupled between the output of the circuit and an ESD clamp circuit of a power line. The inductance value of the inductor is selected such that the inductor has a high impedance at the operating frequency of the circuit and a low impedance at an ESD event.

22 Claims, 4 Drawing Sheets

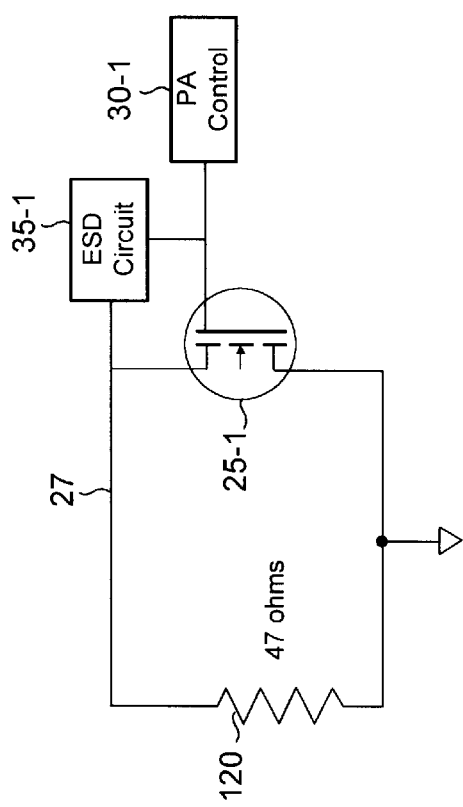
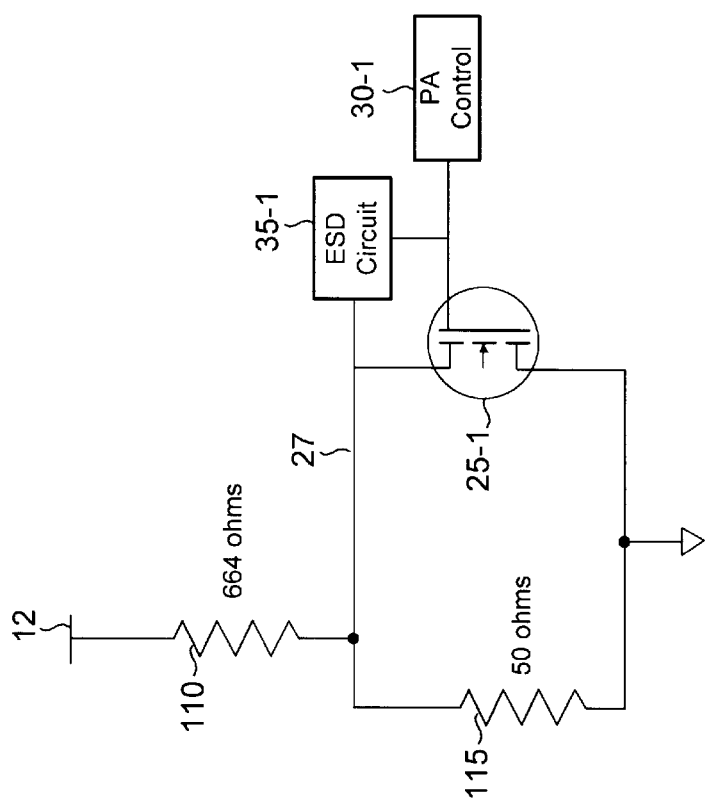

ELECTROSTATIC DISCHARGE PROTECTION USING INDUCTORS

FIELD OF THE INVENTION

The invention relates to electrostatic discharge (ESD) protection, and more particularly, to ESD protection for circuits operating at high frequencies.

BACKGROUND OF THE INVENTION

Electrostatic discharge (ESD) is a problem in integrated circuit (IC) technology. An ESD event occurs when a static charge builds up in a human operator or a machine and discharges through an IC during handling of the IC. This discharge typically produces a large current that passes through the IC in a short duration of time, which may result in damage or destruction of the IC if not properly handled or protected.

Several types of ESD circuits have been designed to protect an IC from failure due to an ESD event. Typically, an ESD circuit provides a current path to ground and/or supply when an ESD event occurs so that the high current resulting from the ESD event bypasses the ESD sensitive circuitry in the IC. ESD circuits may be implemented using gate grounded NMOS transistors, diode circuits and zener diodes. Although ESD circuits have proven useful in protecting ICs from ESD events, ESD circuits typically have a capacitive load. As a result, when an ESD circuit is coupled to the output or input of an IC, the capacitive load of the ESD circuit can degrade the performance of the IC at high frequencies.

Therefore, there is a need for an ESD protection scheme that provides increased ESD protection for a circuit operating at high frequencies without degrading the performance of the circuit.

BRIEF DESCRIPTION OF THE DRAWINGS

FIG. 2 is an equivalent circuit diagram of the circuit of FIG. 1 at an operating frequency.

FIG. 3 is a reduced circuit diagram for FIG. 2.

DESCRIPTION OF THE PREFERRED EMBODIMENTS

The invention provides ESD protection for a circuit operating at a high frequency, wherein the ESD protection is provided for ESD events having pulse frequencies that are lower than the operating frequency of the circuit.

Figure 1:
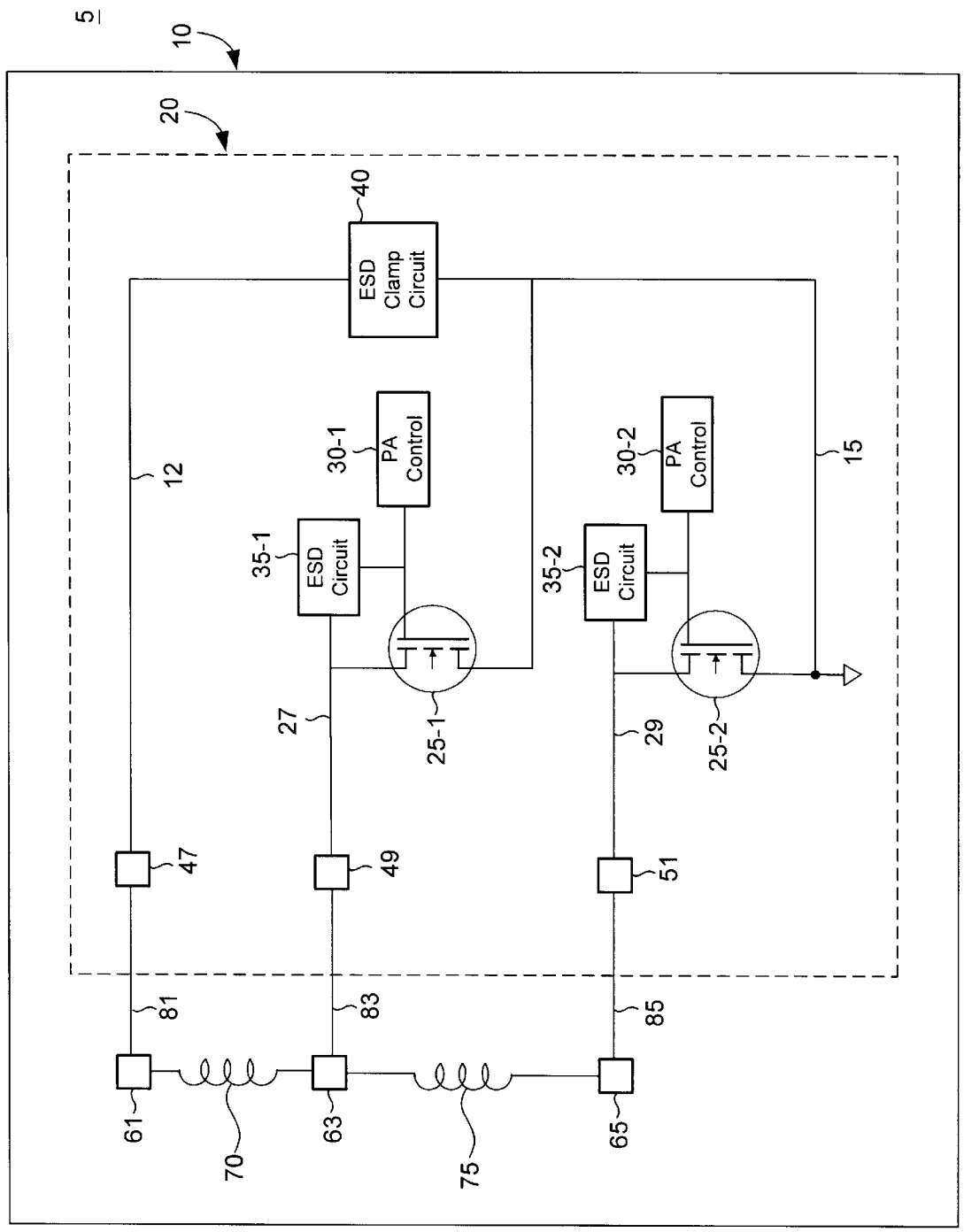
FIG. 1 is a diagram illustrating a circuit package in which an ESD protection scheme according to one embodiment of the invention can be implemented.

Turning to the drawings, FIG. 1 is a diagram illustrating an exemplary circuit package 5 in which an ESD protection scheme according to one embodiment of the invention can be implemented. The circuit package 5 includes an integrated circuit 20 and a package substrate 10. In the illustrated embodiment, the circuit 20 is a Radio Frequency (RF) integrated circuit, but it should be understood that other types of integrated circuits could be used as well. In addition, the circuit 20 of the illustrated embodiment is fabricated on a single silicon die. The package substrate 10 may be a flip-chip package, a ball grid array (BGA) or any other package known in the art. The circuit 20 includes two transistors 25-1, 25-2, two power amplifier (PA) control circuits 30-1, 30-2, two ESD circuits 35-1, 35-2, an ESD clamp circuit 40 and bond pads 47, 49, 51. The package substrate 10 includes bond pads 61, 63, 65 and two inductors 70, 75. For a package substrate 10 fabricated using standard printed circuit board (PCB) technology, the inductors 70, 75 may be fabricated in the package substrate 10, e.g., by forming "S"-shaped conductor traces in the package substrate 10.

In the illustrated embodiment, the circuit 20 operates at a high frequency of 1 gigahertz (GHz) or above, and the transistors 25-1, 25-2 are arranged in a differential power amplifier configuration that produces a negative and positive amplifier output 27, 29, respectively. The negative amplifier output 27 is taken from transistor 25-1, which is coupled to bond pad 49. The positive amplifier output 29 is taken from transistor 25-2, which is coupled to bond pad 51. Transistor 25-1 is driven by PA control circuit 30-1, and transistor 25-2 is driven by PA control if) circuit 30-2. In the example in FIG. 1, each transistor 25-1, 25-2 is an N-channel Metal Oxide Semiconductor (NMOS) transistor. Those skilled in the art will appreciate that other type of transistors may be used instead including, but not limited to, PMOS, JFET, bipolar and MESFETS transistors.

ESD circuit 35-1 is coupled between the negative amplifier output 27 and PA control circuit 30-1 and ESD circuit 35-2 is coupled between the positive amplifier output 29 and PA control circuit 30-2. Each of the ESD circuits 35-1, 35-2 provides ESD protection at the respective amplifier output 27,29 by performing a hard turn on of the respective transistor 25-1, 25-2 when an ESD event occurs. The hard turn on causes the respective transistor 25-1, 25-2 to produce a current path from the respective amplifier output 27,29 to ground 15, which sinks the high current resulting from the ESD event. Each of the ESD circuits 35-1,35-2 may, e.g., be implemented using gate grounded NMOS transistors, diode circuits, zener diodes, low voltage trigger silicon controlled rectifiers (LVTSCRs), or a combination of any of these devices.

The ESD clamp circuit 40 is coupled between a Vcc power supply line 12 and ground 15. The Vcc power line 12 is coupled to bond pad 47. The ESD clamp circuit 40 provides protection for an ESD event on the Vcc power line 12 by clamping the voltage of the Vcc power line 12 to a predetermined voltage level. When the voltage at the Vcc power line 12 rises to the predetermined voltage level during an ESD event, the ESD clamp circuit 40 provides a current path from the Vcc power line 12 to ground 15, which sinks the high current resulting from the ESD event. The ESD clamp circuit 40 may, e.g., be implemented using gate grounded NMOS transistors, diode circuits, zener diodes, low voltage trigger silicon controlled rectifiers (LVTSCRs), or a combination of any of these devices.

On the package substrate 10, bond pad 61 is coupled to bond pad 47 by bonding wire 81 to provide a terminal for coupling the Vcc power line 12 to an external Vcc power supply. Bond pad 63 is coupled bond pad 49 by bonding wire 83 to provide a terminal for coupling the negative amplifier output 27 to an external device. Bond pad 65 is coupled to bond pad 51 by bonding wire 85 to provide a terminal for coupling the positive amplifier output 29 to an external device.

Inductor 70 is coupled between bond pads 61 and 63, and thus, between the Vcc power line 12 and the negative amplifier output 27 of the circuit 20. Alternatively, inductor 70 may be directly coupled between bond pads 47 and 49 of the circuit 20. Inductor 75 is coupled between bond pads 63 and 65, and thus, between the negative and positive amplifier output 27,29, respectively, of the circuit 20. Alternatively, inductor 75 may be coupled directly between bond pads 49 and 51 of the circuit 20.

The inductance value of each inductor 70,75 is selected to provide a high impedance at the operating frequency of the circuit 20 and a low impedance for an ESD event. The high and low impedance are taken with respect to the impedance of the load (not shown) that the circuit 20 is configured to drive. For a load having an impedance of, e.g., 50 ohms, the high impedance may be a few hundred ohms or greater and the low impedance may be less than 10 ohms. For example, a 40 nanoHenry (nH) inductance value for each inductor 70,75 produces a high impedance of about 664 ohms at an operating frequency of 2.4 GHz and a low impedance of less than 7 ohms for an ESD event having a pulse frequency of 25 Megahertz (MHz). Assuming this small inductance value, the inductors 70,75 can be fabricated using standard printed circuit board (PCB) technology.

FIG. 2 shows an equivalent circuit diagram for the negative amplifier output 27 of the circuit 20. In this example, the circuit 20 has an operating frequency of 2.4 GHz and inductor 70 has an inductance value of 40 nH. At 2.4 GHz, inductor 70 has an impedance of 664 ohms, which is depicted by an equivalent 664 ohm load 110 in FIG. 2. In this example, the negative amplifier output 27 is coupled to a 50 ohm load 115, which may, e.g., be a load of a transmission line or antenna. Because the 664 ohm load 110 of inductor 70 is much higher than the 50 ohm load 110 coupled to the negative amplifier output 27, the inductor 70 effectively acts as an open circuit and, therefore, does not appreciably attenuate the negative amplifier output 27. In can also be shown that inductor 75 does not appreciably attenuate the positive amplifier output 29 by following a similar analysis for the positive amplifier output 29. The high impedance of inductor 70 effectively isolates the ESD clamp circuit 40 from the negative amplifier output 27, thereby removing any capacitive load of the ESD clamp circuit 40 from the negative amplifier output 27. This isolation at the operating frequency prevents the capacitive load of the ESD clamp circuit 40 from degrading the performance of the circuit 20.

FIG. 3 shows a reduced circuit diagram for FIG. 2, in which the 664 ohm load 110 of inductor 70 and the 50 ohm load 115 of FIG. 2 have been combined into an equivalent 47 ohms load 120. The combined impedance of 47 ohm is not much different than the 50 ohm load 115. Therefore, signal losses due to inductor 70 are low, typically only a few percent, and performance degradation of the circuit 20 is minimal.

Figure 4:
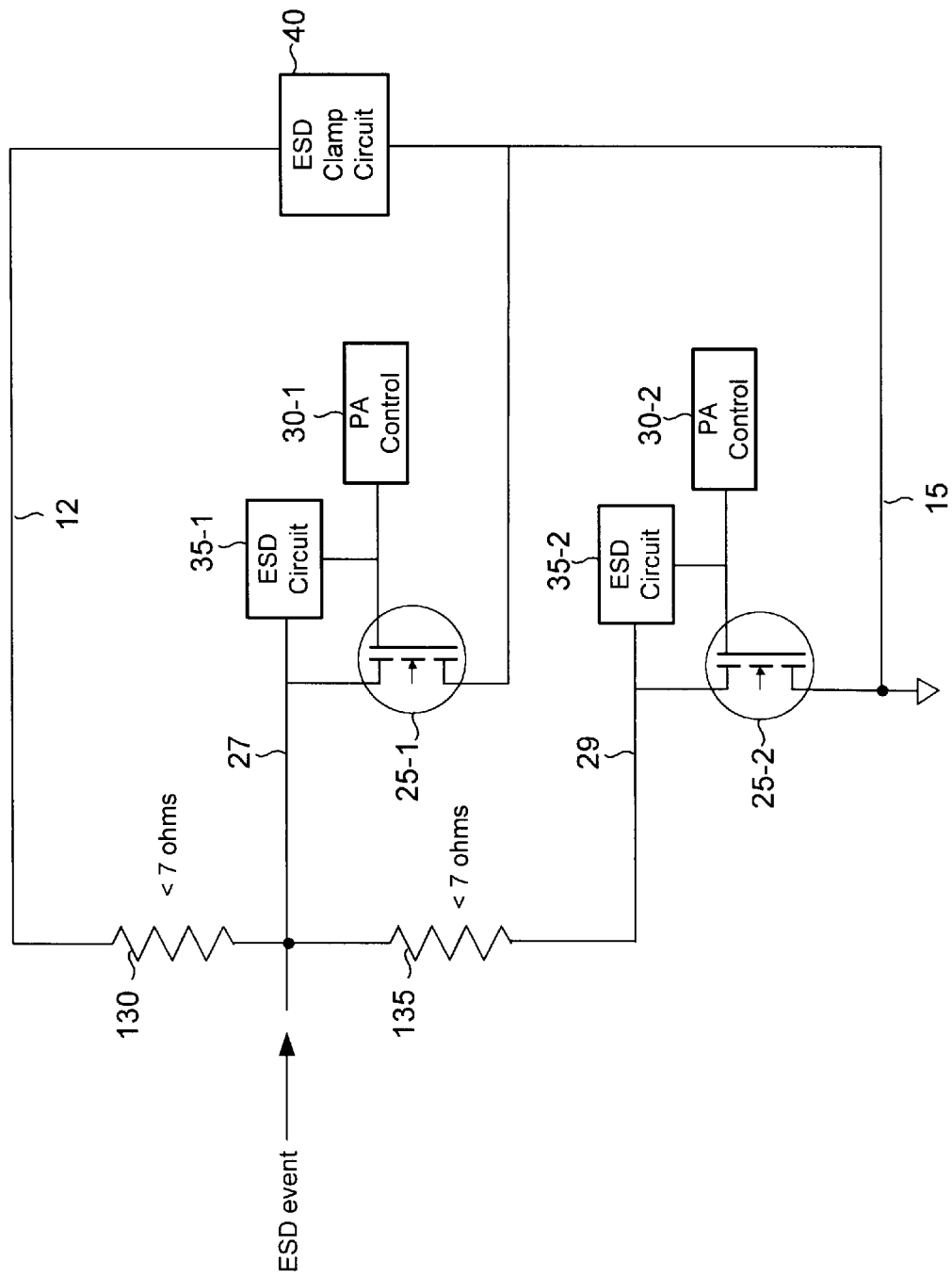
FIG. 4 is an equivalent circuit diagram of the circuit of FIG. 1 during an ESD event.

FIG. 4 shows an equivalent circuit diagram for the circuit 20 and inductor 70,75 for an ESD event occurring at the negative amplifier output 27. In this example, the ESD event has a pulse frequency of 25 MHz, and the inductors 70, 75 each have an inductance of 40 nH. For the ESD event, each inductor 70, 75 has a low impedance of less than 7 ohms, which is depicted in FIG. 4 by equivalent loads 130,135, respectively. For the ESD event at the negative amplifier output 27, ESD circuit 35-1 performs a hard turn on of transistor 25-1, thereby providing a first current path to ground 15 for the ESD event. In addition, inductor 70 effectively acts as a short circuit that couples the ESD event to the Vcc power supply line 12. This activates the ESD clamp circuit 40 coupled to the Vcc power line 12 to provide a second current path to ground 15 for the ESD event.

Furthermore, inductor 75 effectively acts as a short circuit that couples the ESD event to the positive amplifier output 29. This causes ESD circuit 35-2 to perform a hard turn on of transistor 25-2, thereby providing a third current path to ground 15 for the ESD event. Thus, the ESD protection scheme of the invention actives both ESD circuits 35-1,35-2 and the ESD clamp circuit 40, providing three current paths to ground to sink the current due to the ESD event. Although discussed for an ESD event occurring at the negative amplifier output 27, the ESD protection scheme of the invention also actives both ESD circuits 35-1, 35-2 and the ESD clamp circuit 40 for an ESD event occurring at the positive amplifier output 29 and/or the Vcc power line 12. By activating both ESD circuits 35-1,35-2 and the ESD clamp circuit 40 when an ESD event occurs, the ESD protection scheme of the invention increases the amount of current that can be sunk during the ESD event, resulting in increased ESD protection.

Therefore, the ESD protection scheme according to the invention increases ESD protection for a circuit without significantly degrading the performance of the circuit. The ESD protection scheme may be applied to a single-ended amplifier as well as a differential amplifier, e.g., by coupling an inductor between the output of the single-ended amplifier and an ESD clamp circuit of a power line. In addition, the ESD protection scheme may be applied to the input, as well as the output, of a circuit, e.g., by coupling an inductor between the input of the circuit and an ESD circuit of a power line. Furthermore, the ESD protection scheme may be applied to the input and/or output of a digital or an analog circuit.

Figure 5:
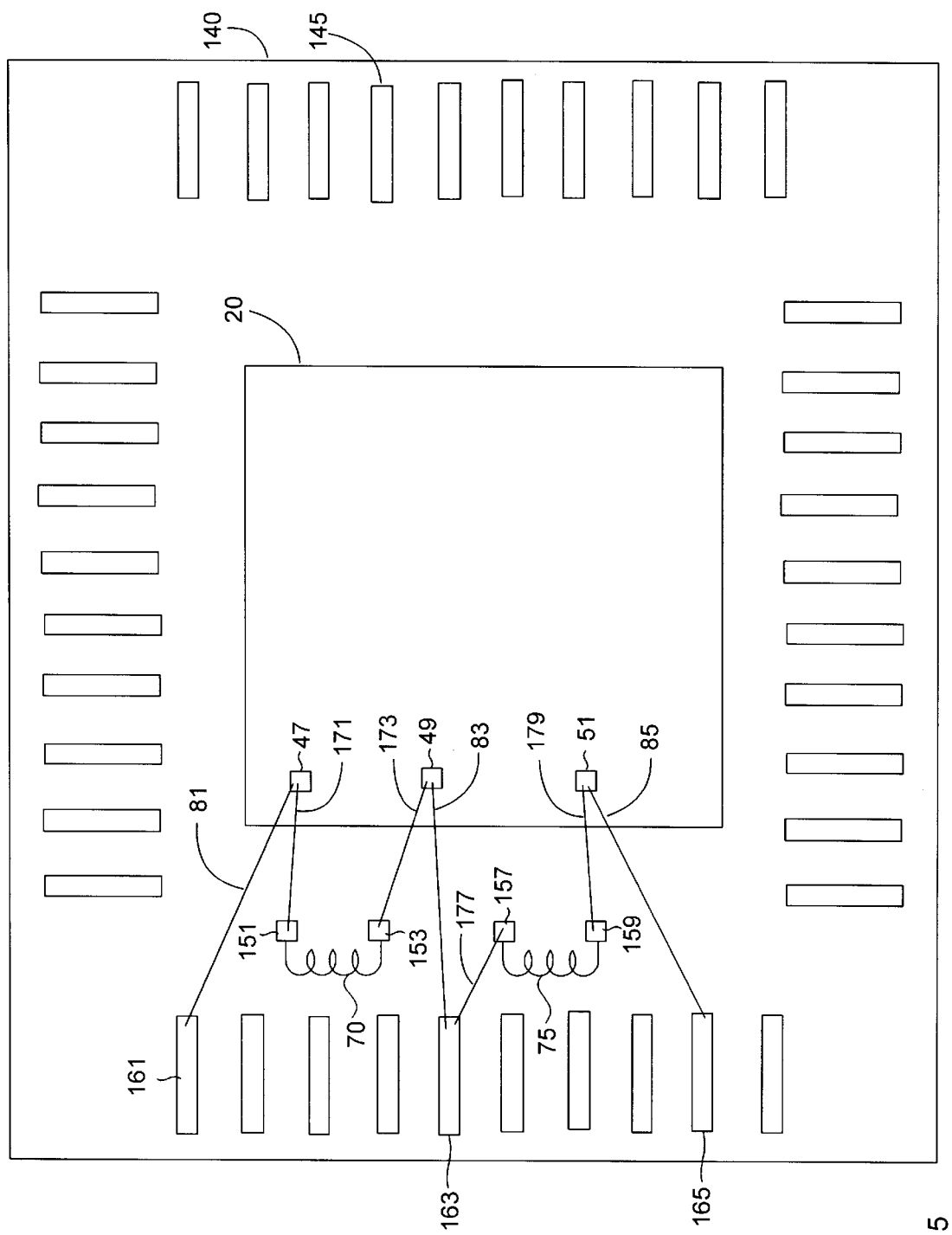
FIG. 5 illustrates a circuit package according to an embodiment of the invention.

FIG. 5 illustrates an exemplary circuit package according to an embodiment of the invention. The package substrate 140 of this embodiment includes a plurality of leads 145 spaced along its sides. The package substrate 140 is made using a printed circuit board (PCB) process. The circuit 20 is mounted on the package 140. For ease of illustration, only the bond pads 47, 49, 51 of the circuit 20 are shown in FIG. 5. Lead 161 is coupled bond pad 47 by bonding wire 81 to provide a terminal for coupling the Vcc power line 12 of the circuit 20 to an external Vcc power supply. Lead 163 is coupled bond pad 49 by bonding wire 83 to provide a terminal for coupling the negative amplifier output 27 to an external device. Lead 165 is coupled to bond pad 51 by bonding wire 85 to provide a terminal for coupling the positive amplifier output 29 to an external device.

The inductors 70,75 are fabricated in the package substrate 10. The package substrate includes a bond pad 151 coupled to one end the inductor 70 and a bond pad 153 coupled to the other end of the inductor 70. Bond pad 151 is coupled to bond pad 47 by bonding wire 171, and bond pad 153 is coupled to bond pad 49 by bonding wire 173. The package substrate 140 also includes pad 157 coupled to one end the inductor 75 and a bond pad 159 coupled to the other end of the inductor 75. Bond pad 157 is coupled to lead 163 by bonding wire 177, and bond pad 159 is coupled to bond pad 51 by bonding wire 179.

Although the leads 161,163,165 of the package substrate 140 are shown coupled to the bond pads 47,49,51 of the circuit 20 by bonding wires 81,83,85, respectively, the leads 161,163,165 may also be coupled to bond pads 47,49,51 by conductive traces inn the package substrate. This may be done, e.g., by flipping the circuit 20 over so that bond pads 47,49,51 face the package substrate 140 and having conductive traces in the package substrate 140 run from the leads 161,163,165 to the bond pads 47,49,51.

While various embodiments of the application have been described, it will be apparent to those of ordinary skill in the art that many more embodiments and implementations are possible that are within the scope of the subject invention. Therefore, the invention is not to be restricted or limited except in accordance with the following claims and their equivalents.

What is claimed is:

1. An electrostatic discharge (ESD) protected circuit, comprising:
   a first circuit having an output and an operating frequency; an ESD clamp circuit;
   a first inductor coupled between the output of the first circuit and the ESD clamp circuit, wherein the first inductor has an inductance value such the first inductor has a higher impedance at the operating frequency of the first circuit and a lower impedance at an ESD event, wherein the first circuit has a first and a second output, and the first inductor is coupled between the first output and the ESD clamp circuit; and
   a second inductor, wherein the second inductor is coupled between the first output and the second output of the first circuit, and the second inductor has an inductance value such that the second inductor has a higher impedance at the operating frequency of the first circuit and a lower impedance at the ESD event.

2. The ESD protected circuit of claim 1, wherein the second inductor has an impedance of less than 10 ohms at the ESD event.

3. The ESD protected circuit of claim 1, further comprising:
   a first ESD circuit coupled to the first output of the first circuit; and
   a second ESD circuit coupled to the second output of the first circuit.

4. An electrostatic discharge (ESD) protected circuit package, comprising:
   a package substrate;
   a first circuit mounted on the package substrate, the first circuit having an output and an operating frequency;
   an ESD clamp circuit;
   a first inductor coupled between the output of the first circuit and the ESD clamp circuit, wherein the first inductor has an inductance value such that the first inductor has a higher impedance at the operating frequency of the first circuit and a lower impedance at an ESD event, wherein the first circuit has a first and second output, and the first inductor is coupled between the first output and the ESD clamp circuit; and
   a second inductor, wherein the second inductor is coupled between the first output and the second output of the first circuit, and the second inductor has an inductance value such that the second inductor has a higher impedance at the operating frequency of the first circuit and a lower impedance at the ESD event.

5. The circuit package of claim 4, wherein the package substrate is a printed circuit board and the second inductor is fabricated in the package substrate.

6. An electrostatic discharge (ESD) protected circuit, comprising:
   a first circuit having an operating frequency; voltage clamping means;
   first impedance means for providing a higher impedance between the first circuit and the voltage clamping means at the operating frequency and a lower impedance between the first circuit and the voltage clamping means at an ESD event; ESD protection means; and
   second impedance means for providing a higher impedance between the first circuit and the ESD protection means at the operating frequency and a lower impedance between the first circuit and the ESD protection means at the ESD event.

7. The ESD protected circuit of claim 6, wherein the lower impedance of each of the first and second impedance means is less than 10 ohms.

8. The ESD protected circuit of claim 1, wherein the first inductor has an impedance of less than 10 ohms at the ESD event.

9. The ESD protected circuit of claim 1, wherein the operating frequency of the first circuit is above 1 gigahertz.

10. The ESD protected circuit of claim 1, wherein the first inductor has an impedance of less than 10 ohms at the ESD event.

11. The ESD protected circuit of claim 1, wherein the ESD clamp circuit is coupled to a power line.

12. The ESD protected circuit of claim 1, wherein the ESD clamp circuit clamps the voltage on the power line to a predetermined voltage level.

13. The ESD protected circuit of claim 1, wherein the first circuit comprises a transistor having an output and the output of the first circuit is taken from the output of the transistor.

14. The circuit package of claim 4, wherein the package substrate is a printed circuit board and the first inductor is fabricated in the package substrate.

15. The circuit package of claim 4, wherein the package substrate is a ball grid array.

16. The circuit package of claim 4, wherein the package substrate is a flip-chip package.

17. The circuit package of claim 4, wherein the first inductor has an impedance of less than 10 ohms at the operating frequency of the first circuit.

18. The circuit package of claim 4, wherein the operating frequency of the first circuit is above 1 gigahertz.

19. The circuit package of claim 18, wherein the first inductor has an impedance of less than 10 ohms at the operating frequency of the first circuit.

20. The ESD protected circuit of claim 6, wherein the operating frequency is 1 gigahertz or above.

21. The ESD protected circuit of claim 6, wherein the lower impedance is less than 10 ohms.

22. The ESD protected circuit of claim 6, wherein the voltage clamping means is coupled to a power line.

* * * * *